United States Patent
Hwan et al.

(10) Patent No.: US 8,344,500 B2
(45) Date of Patent: Jan. 1, 2013

(54) INTEGRATED CIRCUIT PACKAGE MODULE AND METHOD OF THE SAME

(75) Inventors: Lu-Chen Hwan, Taipei (TW); Po Ching Chen, Jhubei (TW)

(73) Assignee: Mutual-Pak Technology Co., Ltd., Taipei County, Xinzhuang (TW)

( * ) Notice: Subject to any disclaimer, the term of this patent is extended or adjusted under 35 U.S.C. 154(b) by 463 days.

(21) Appl. No.: 12/471,712

(22) Filed: May 26, 2009

(65) Prior Publication Data

US 2009/0294953 A1 Dec. 3, 2009

(30) Foreign Application Priority Data

Jun. 2, 2008 (TW) ................................. 97120461 A

(51) Int. Cl.
*H01L 23/522* (2006.01)
(52) U.S. Cl. ................. 257/699; 257/693; 257/E21.499
(58) Field of Classification Search .................. 257/699, 257/48, 704, E23.142, E21.499
See application file for complete search history.

(56) References Cited

U.S. PATENT DOCUMENTS 6,774,467 B2  8/2004  Horiuchi et al.

FOREIGN PATENT DOCUMENTS

TW  200723474  6/2007

OTHER PUBLICATIONS

Notice of Examination Opinion mailed Feb. 12, 2012 in corresponding Taiwan Application No. 97120461.

*Primary Examiner* — Roy Potter
(74) *Attorney, Agent, or Firm* — Snell & Wilmer L.L.P.

(57) ABSTRACT

The present invention discloses an integrated circuit module and method of manufacturing the same. The integrated circuit module includes a chip and a carrier supporting the chip. The carrier defines a front side and a back side, and the chip is disposed on the front side. The carrier includes a first insulating layer defining a first opening at the back side, a second insulating layer defining a second opening and a chip accommodation opening at the front side, and a patterned conductive layer sandwiched in between the first insulating layer and the second insulating layer. The patterned conductive layer is formed with an inner contacting portion exposed through the chip accommodation opening and an outer contacting portion exposed through the first opening and the second opening. The inner contacting portion is connected to the chip through the chip accommodation opening. The outer contacting portion is provided for electronically connecting an electronic device to the patterned conductive layer selectively at the front side through the second opening and at the back side through the first opening.

20 Claims, 6 Drawing Sheets

INTEGRATED CIRCUIT PACKAGE MODULE AND METHOD OF THE SAME

CROSS-REFERENCE TO RELATED APPLICATIONS

This application claims priority to Taiwan Patent Application No. 97120461 entitled "INTEGRATED CIRCUIT PACKAGE MODULE AND METHOD OF THE SAME," filed on Jun. 2, 2008, which is incorporated herein by reference and assigned to the assignee herein.

FIELD OF INVENTION

This invention relates to an integrated circuit package module and method of the same, and more particularly, relates to an integrated circuit package module having a carrier and method of the same.

BACKGROUND OF THE INVENTION

Conventionally, external connection for the integrated circuit devices is established by the following steps: mounting a chip on a lead frame; electrically connecting I/O pads of the chip to contacts of the lead frame by wire-bonding; and sealing the chip to complete the package process. Because the lead wires may increase the size of chip package, the wire bonding process is gradually replaced by the leadless packaging technique which can avoid the use of wirebonds.

FIG. 1 illustrates an integrated circuit module 100 made by the known leadless packaging technique. As shown in FIG. 1, the integrated circuit module 100 includes a chip 10 and a carrier 12. At first, conductive bumps 11 are formed on the chip 10 and outer circuit contacts 13 are disposed on the carrier 12. Then, the integrated circuit module 100 can be formed by reversing the chip 10, connecting the conductive bumps 11 to the corresponding outer circuit contacts 13, and then applying anisotropic conductive adhesive layers between the chip 10 and the external circuit contacts 13.

However, the integrated circuit module 100 in FIG. 1 has a restricted variety of external connection and unsatisfactory heat dissipation performance due to the simple structure. Therefore, it is desired to have a novel intergraded circuit module and a method of the same to resolve the above-mentioned problems.

SUMMARY OF THE INVENTION

In light of the foregoing, it is one object of the present invention to provide an integrated circuit module with more external contact interfaces for improving the heat dissipation performance of the chip and increasing the variety of external connection options.

According to one embodiment, the present invention provides an integrated circuit module including a chip and a carrier supporting the chip. The carrier defines a front side and a back side, and the chip is disposed on the front side. The carrier includes a first insulating layer defining a first opening at the back side, a second insulating layer defining a second opening and a chip accommodation opening at the front side, and a patterned conductive layer sandwiched in between the first insulating layer and the second insulating layer. The patterned conductive layer is formed with an inner contacting portion exposed through the chip accommodation opening and an outer contacting portion exposed through the first opening and the second opening. The inner contacting portion is connected the chip through the chip accommodation opening, and the outer contacting portion is provided for electronically connecting an electronic device to the patterned conductive layer selectively at the front side of the carrier through the second opening and at the back side of the carrier through the first opening.

According to another embodiment, the present invention provides an integrated circuit module including a circuit board, a chip, and a carrier supporting the chip. The carrier defines a front side and a back side, and the chip is disposed on the front side. The carrier includes a first insulating layer defining a first opening at the back side, a second insulating layer defining a second opening and a chip accommodation opening at the front side, and a patterned conductive layer sandwiched in between the first insulating layer and the second insulating layer. The patterned conductive layer is formed with an inner contacting portion exposed through the chip accommodation opening and an outer contacting portion exposed through the first opening and the second opening. The chip is connected to the inner contacting portion through the chip accommodation opening, and the circuit board is connected to the outer contacting portion selectively at the front side through the second opening and the back side through the first opening According to still another embodiment, the present invention provides a method for manufacturing an integrated circuit module. The method includes the following steps: providing a first insulating layer defining a first opening; forming a patterned conductive layer above the first insulating layer, the patterned conductive layer having an outer contacting portion and an inner contacting portion, the outer contacting portion exposed in the first opening; forming a second insulating layer above the patterned conductive layer, the second insulating layer defining a second opening exposing the outer contacting portion and a chip accommodation opening exposing the inner contacting portion; providing a chip; and connecting the chip to the inner contacting portion through the chip accommodation opening.

Other aspects of the present invention would be stated and easily understood through the following description or the embodiments of the present invention. The aspects of the present invention would be appreciated and implemented by the elements and their combinations pointed out in the appended claims. It should be understood that the above summary of the invention and the following detailed description are only illustrative but not to limit the present invention.

BRIEF DESCRIPTION OF THE DRAWINGS

The drawings are employed to illustrate the embodiments and the principles of the present invention in conjunction with the description. However, it should be understood that the present invention is not limited to the shown configurations and elements, in which.

DETAILED DESCRIPTION OF THE PREFERRED EMBODIMENTS

Figure 1:
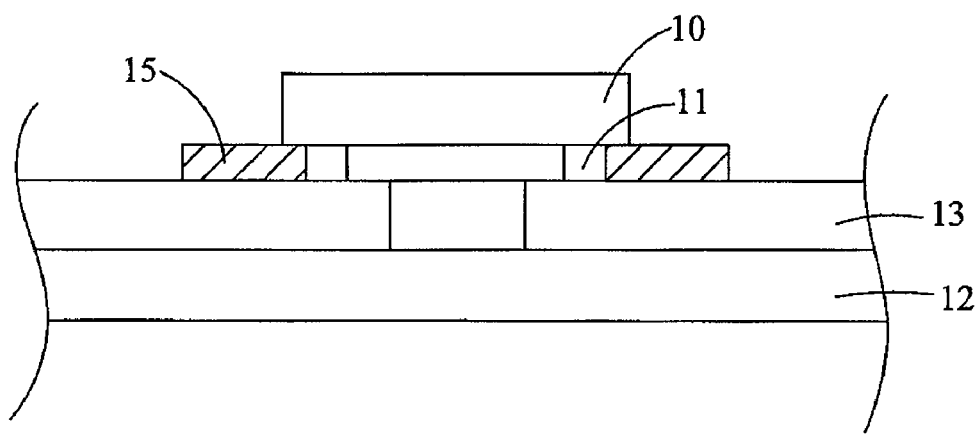
FIG. 1 illustrates a cross-sectional view of an conventional integrated circuit module.

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as not to unnecessarily obscure the features of the invention.

Figure 2:
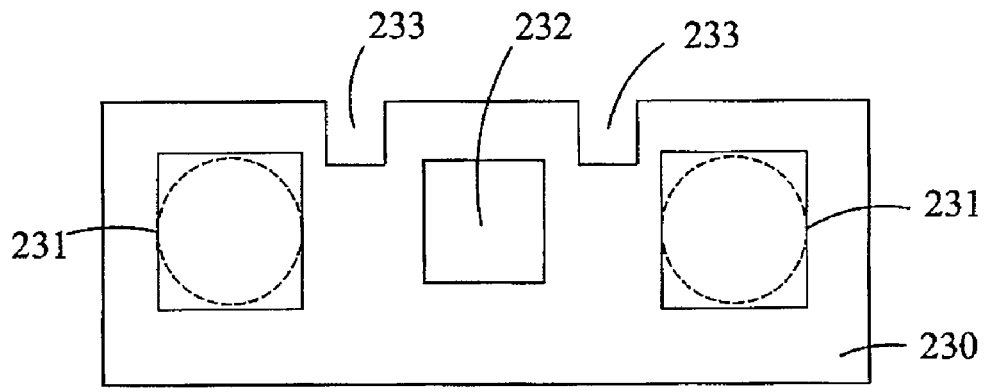
FIG. 2 shows an explosive view of a carrier in accordance with one embodiment of the present invention.
Figure 2:
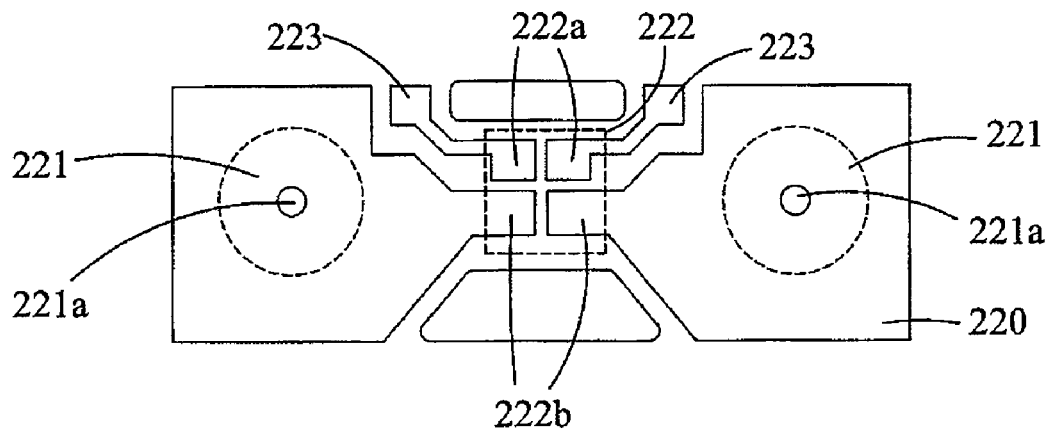
Figure 2:
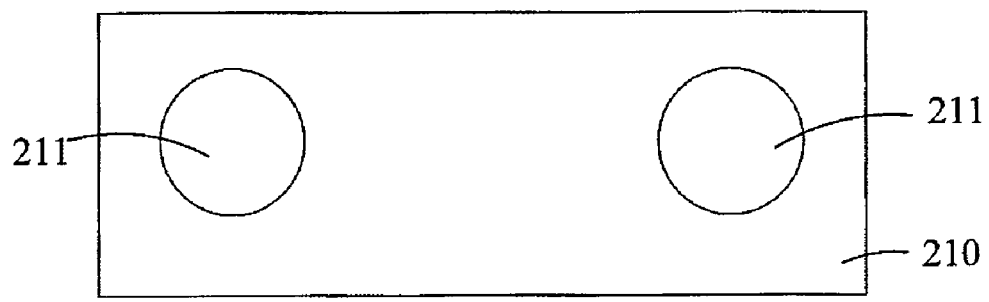

FIG. 2 shows an explosive view of a carrier 200 supporting a chip in accordance with one embodiment of the present invention, which is used here to illustrate the structure of the carrier 200 and method of the same. As shown in FIG. 2, the method of manufacturing the carrier 200 includes providing a first insulating layer 210. The first insulating layer 210 can be made of polyimide, polyethylene terephthalate, epoxy resin, material of dielectric layer having glass fiber typically used in printed circuit board (such as the glass fiber plate used in FR$_4$), or the combinations thereof. At least one first opening 211 is formed on the first insulating layer 210 by, for example, the known laser drilling process or punching/stamping process.

Next, referring to FIG. 2 again, a patterned conductive layer 220 is formed to cover the first insulating layer 210. The patterned conductive layer 220 defines an outer contacting portion 221 and an inner contacting portion 222. The outer contacting portion 221 is corresponding to the first opening 211 of the first insulating layer 210, and therefore the outer contacting portion 221 is exposed through the first opening 211. The inner contacting portion 222 forms a plurality of first electrodes 222a and 222b for electrically connecting the chip to be supported later. Except for the first electrodes 222a and 222b, the patterned conductive layer 220 further includes a plurality of second electrodes 223. The second electrodes 223 are electrically connected to the first electrodes 222a. The second electrodes 223 are for testing performance of the chip to be supported later. Furthermore, the patterned conductive layer 220 further defines a through hole 221a in the outer contacting portion 221. The function of the through hole 221a will be described in detail hereinafter. The patterned conductive layer 220 can be made of copper or any other suitable conductive material. The patterned conductive layer 220 can be formed by, but not limited to, providing a copper foil covering the surface of the first insulating layer 210, patterning the copper foil by the conventional photolithography and etching process to form the above-mentioned outer contacting portion 221, the through hole 221a, and the first electrodes 222a/222b and the second electrodes 223 of the inner contacting portion 222. It should be noted that the through hole 221a can be formed by either the photolithography and etching process or a known drilling process.

Next, referring to FIG. 2 again, a second insulating layer 230 is formed to cover the patterned conductive layer 220. The second insulating layer 230 defines a second opening 231 to expose the outer contacting portions 221, a chip accommodation opening 232 to expose the inner contacting portions 222, and third opening 233 to expose the second electrodes 223. The second insulating layer 230 can be made of solder mask, solder resist, or any other suitable material, such as polyimide. In one embodiment using the solder mask as the material of the second insulating layer 230, the second insulating layer 230 can be formed by coating the surface of the second insulating layer 230 with the solder mask, and then patterning the solder mask by the conventional photolithography and etching process to form the above-mentioned openings.

Figure 3:
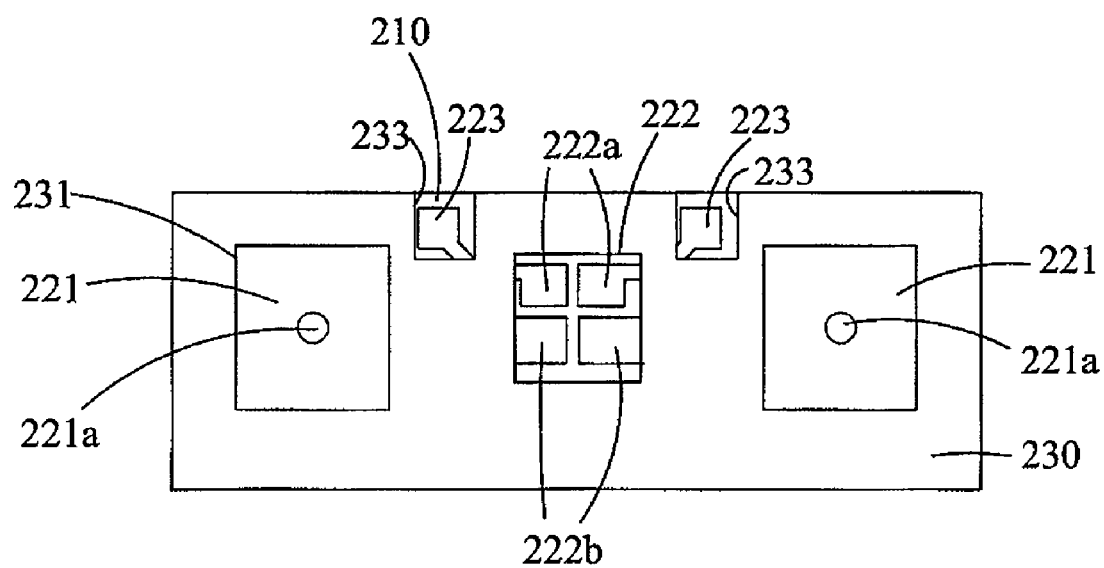
FIG. 3 is a top view of the carrier in FIG. 2.

FIG. 3 is a top view of a carrier 200 formed by combining the three layers of FIG. 2. As shown in FIG. 3, the outer contacting portion 221 of the patterned conductive layer 220 is exposed through the second opening 231 of the second insulating layer 230, the second electrodes 223 of the patterned conductive layer 220 are exposed through the third opening 233 of the second insulating layer 230, and the plurality of first electrodes 222a and 222b of the inner contacting portion 222 of the patterned conductive layer 220 are exposed through the chip accommodation opening 232 of the second insulating layer 230. It can be seen that the chip to be supported by the carrier 200 can be disposed on the chip accommodation openings 232 for being connected to the plurality of first electrodes 222a and 222b of the inner contacting portion 222.

Figure 4A:
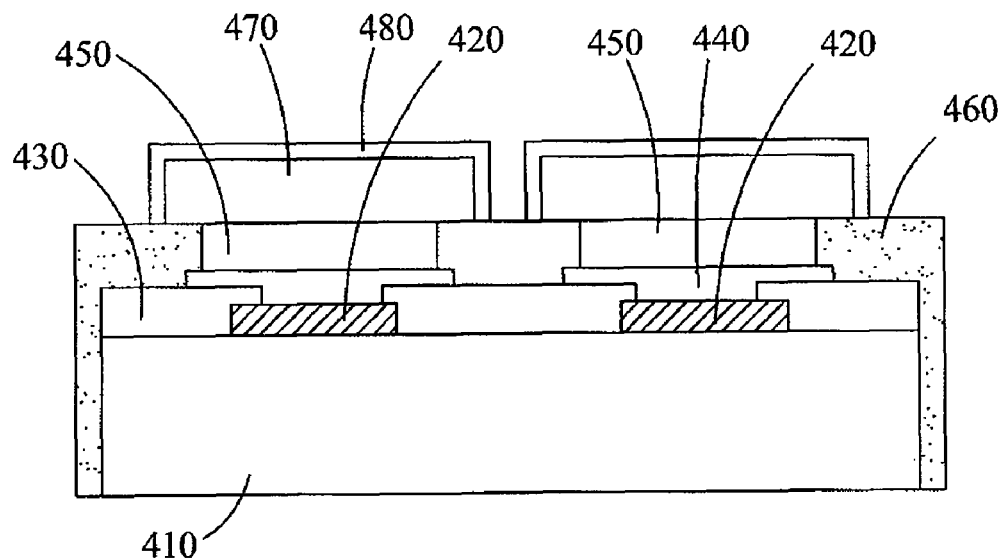
FIG. 4A is a cross-sectional view of a chip in accordance with one embodiment of the present invention.
Figure 4B:
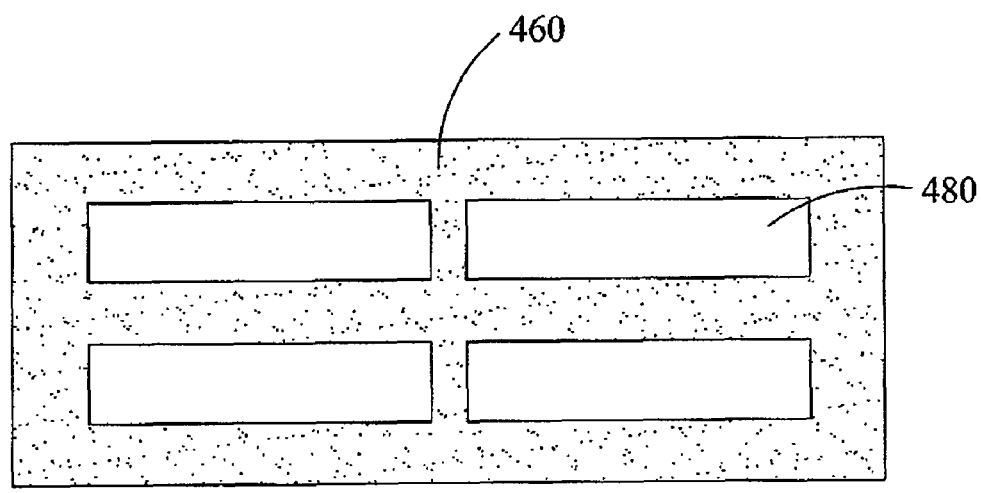
FIG. 4B is a top view of the chip in FIG. 4A.

FIGS. 4A and 4B are cross-sectional view and top view of a chip 400 respectively in accordance with one embodiment of the present invention. As shown in FIG. 4A, a packaged chip 400 includes an integrated circuit device 410, a plurality of I/O pads 420, a passivation layer 430, a plurality of extended contacts 440, a plurality of inner conductive bumps 450, a protective layer 460, a plurality of outer conductive bumps 470, and a surface metal layer 480. The integrated circuit device 410 can be a diode (such as a light-emitting diode, a photodiode, a laser diode, or a rectifier diode) or a transistor (such as MOS, CMOS, etc.). The plurality of I/O pads 420 and the passivation layer 430 are disposed on the upper surface of the integrated circuit device 410. The plurality of extended contacts 440 are disposed above the plurality of I/O pads 420 to expand the external contact area of the plurality of I/O pads 420. The plurality of I/O pads 420 and the extended contacts 440 can be made of any suitable conductive material, and the passivation layer 430 can be made of silicon oxynitride or other dielectric material. The plurality of inner conductive bumps 450 are disposed above the extended contacts 440, and the protective layer 460 surrounds the integrated circuit device 410, the plurality of I/O pads 420, the passivation layer 430, the extended contacts 440, and the inner conductive bumps 450. The plurality of outer conductive bumps 470 are disposed above the inner conductive bumps 450 and are configured to electrically connect the integrated circuit device 410 to the inner contacting portion 222 of the carrier 200. The inner conductive bumps 450 and the outer conductive bumps 470 can be made of compound material having metal grains and polymer. The material of the protective layer 460 can be chosen from epoxy resin, polyimide, Benzocyclobutane, liquid crystal polymer, and any other suitable dielectric material. The surface metal layer 480 covers the outer conductive bumps 470, and can be made of nickel, gold, the combination thereof, or any other suitable material capable of electrically connecting the chip 400 to other devices. The manufacturing method of the chip 400 can refer to the Taiwan patent application Ser. No. 96116302, which is incorporated herein by reference. However, it should be noted that, except for the chip 400, the present invention can also apply to other chips.

Figure 5A:
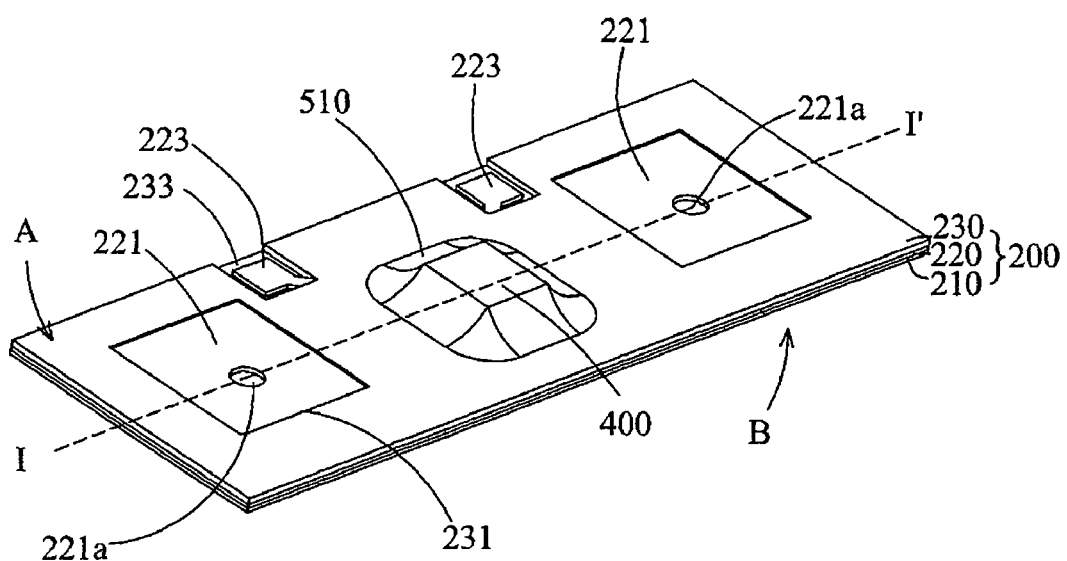
FIG. 5A illustrates a cross-sectional view of an integrated circuit module in accordance with one embodiment of the present invention.
Figure 5B:
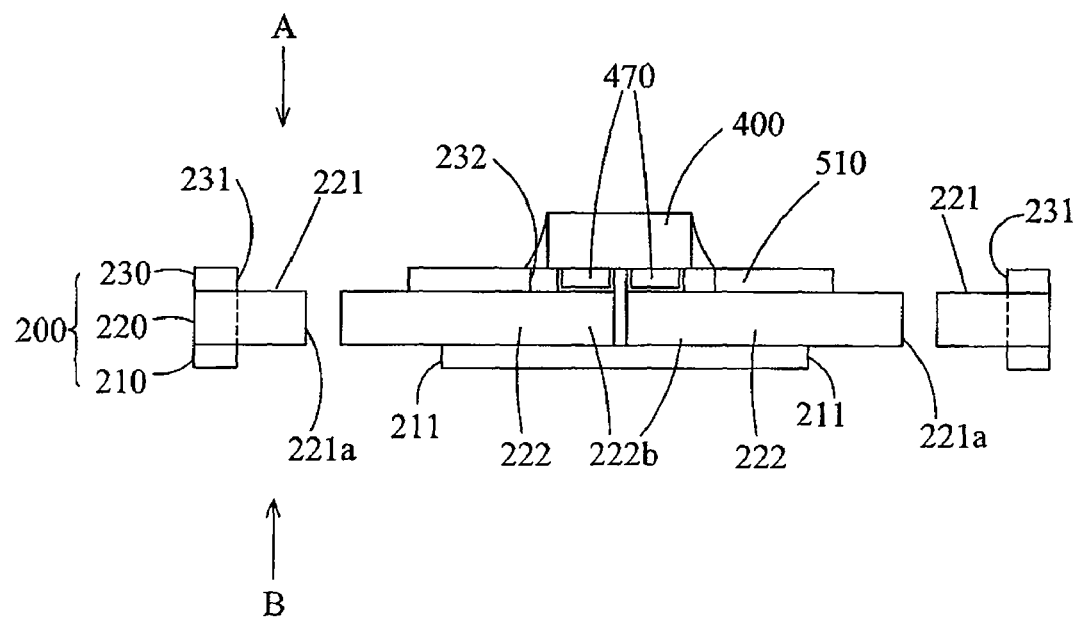
FIG. 5B illustrates a cross-sectional view of the integrated circuit module in FIG. 5A.

FIG. 5A shows a schematic view of an integrated circuit module 500 according to one embodiment of the present invention, and FIG. 5B shows a cross-sectional profile taken along the dotted line I-I'. As shown in FIGS. 5A and 5B, the above-mentioned carrier 200 is adopted to manufacture the integrated circuit module 500, in which the chip 400 is mounted on the carrier 200, and an underfill layer 510 is formed on the surface of the carrier 200 to surround the chip 400 for fixing the chip 400 on the second insulating layer 230 of the carrier 200. The underfill layer 510 can be made of epoxy resin, polypropylene, acrylic resin, silicone, or the combinations thereof. In detail, the integrated circuit module 500 includes the chip 400 and the carrier 200 supporting the chip 400. The carrier 200 includes the first insulating layer 210 disposed on back side B, the second insulating layer 230 disposed on front side A, and the patterned conductive layer 220 sandwiched in between the first insulating layer 210 and the second insulating layer 230. The first insulating layer 210 defines the first opening 211, and the second insulating layer 230 defines the second opening 231 and the chip accommodation opening 232. The patterned conductive layer 220 includes the inner contacting portion 222 exposed through the chip accommodation opening 232 and the outer contacting portion 221 exposed through the first opening 211 and the second opening 231. The inner contacting portion 222 connects to the chip 400 through the chip accommodation opening 232. In this embodiment, the outer contacting portion 221 is configured to be connected to external electronic device (not shown). Because the outer contacting portion 221 is exposed through the first opening 211 and the second opening 231, the electronic device can be selectively disposed on the front side B of the carrier 220 through the first opening 211 and on the back side A of the carrier 220 through the second opening 231. As shown in FIGS. 5A and 5B, the carrier 200 further includes the through hole 221a in the outer contacting portion 221. The through hole 221a connects the second openings 231 and the first opening 211, and both the second opening 231 and the first opening 211 are larger than the through hole 221a. It should be noted that, in this embodiment of the present invention, the inter contacting portion 222 includes a plurality of first electrodes 222b and 222a, the chip 400 includes a plurality of outer conductive bumps 470, and the step of connecting the chip 400 to the inter contacting portion 222 includes connecting the plurality of first electrodes 222b and 222a to the plurality of outer conductive bumps 470 respectively.

Figure 6:
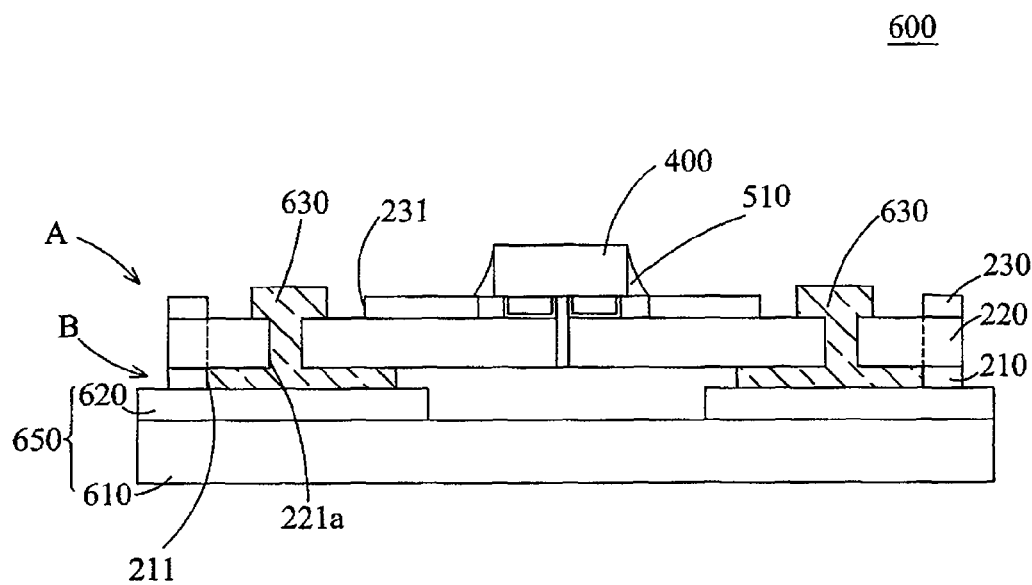
FIG. 6 illustrates a cross-sectional view of an integrated circuit module in accordance with another embodiment of the present invention.

FIG. 6 illustrates an integrated circuit module 600 in which the circuit board 650 is disposed on the back side B of the carrier 200 in accordance with one embodiment of the present invention. To put it in detail, the method for manufacturing the integrated circuit module 600 includes: providing a circuit board 650 having a substrate 610 and contacts 620 formed thereon; disposing the circuit board 650 on the back side B of the carrier 200 (i.e. the side near the first insulating layer 210); and forming a conductive adhesive layer 630 to fill the first opening 211, the second opening 231, and the through hole 221a, wherein the conductive adhesive layer 630 is adhere to the contacts 620 of the circuit board 650. The conductive adhesive layer 630 can be made of any other suitable metal paste.

Figure 7:
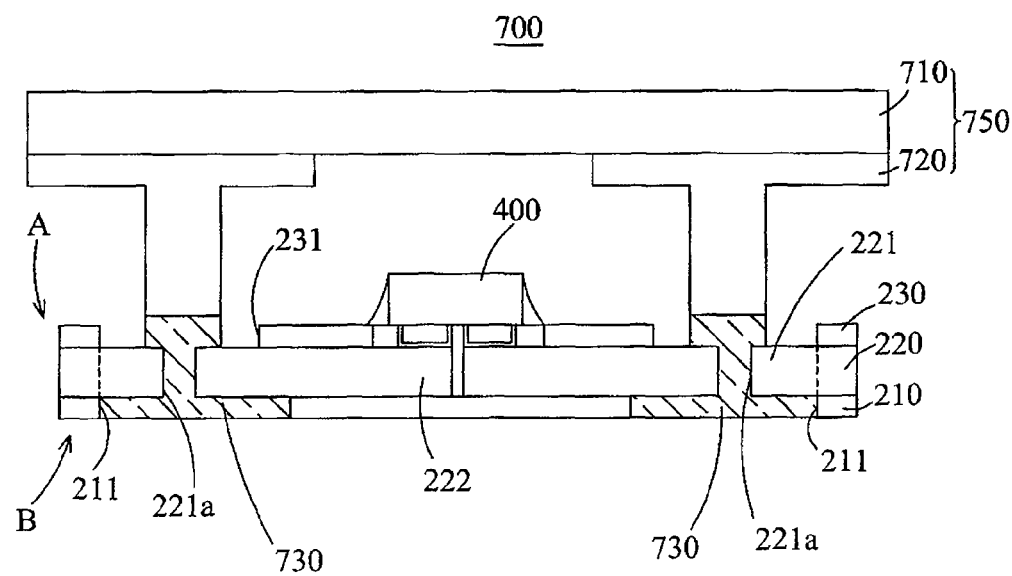
FIG. 7 illustrates a cross-sectional view of an integrated circuit module in accordance with still another embodiment of the present invention.

FIG. 7 illustrates an integrated circuit module 700 in which the circuit board 750 is disposed on the back side A of the carrier 200 in accordance with one embodiment of the present invention. In detail, the method for manufacturing the integrated circuit module 700 includes: providing a circuit board 750 having a substrate 710 and contacts 720 formed thereon; disposing the circuit board 750 on the front side A of the carrier 200 (i.e. the side near the second insulating layer 230); and forming a conductive adhesive layer 730 to fill the first opening 211, the second opening 231, and the through hole 221a, wherein the conductive adhesive layer 730 is adhered to the contacts 720 of the circuit board 750.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

We claim:

1. An integrated circuit module, comprising:
   a chip; and
   a carrier supporting the chip, the carrier defining a front side and a back side, the chip being disposed on the front side, the carrier comprising:
   a first insulating layer defining a first opening at the back side;
   a second insulating layer defining a second opening and a chip accommodation opening at the front side; and
   a patterned conductive layer sandwiched in between the first insulating layer and the second insulating layer, the patterned conductive layer being formed with an inner contacting portion exposed through the chip accommodation opening and an outer contacting portion exposed through the first opening and the second opening, wherein the inner contacting portion connects the chip through the chip accommodation opening and the outer contacting portion is provided for electronically connecting an electronic device to the patterned conductive layer selectively at the front side through the second opening and at the back side through the first opening, and wherein the patterned conductive layer defines a through hole in the outer contacting portion, the through hole communicating with the second opening and the first opening and a conductive adhesive layer is added into the first opening, the second opening, and the through hole so as to adhere the carrier to the electronic device.

2. The integrated circuit module according to claim 1, wherein the first insulating layer is made of a material selected from the group consisting of polyimide, polyethylene terephthalate, epoxy resin, glass fiber, and the combinations thereof.

3. The integrated circuit module according to claim 1, wherein both the second opening and the first opening are larger than the through hole.

4. The integrated circuit module according to claim 1, wherein the inner contacting portion comprises a plurality of first electrodes for electronically connecting to the chip.

5. The integrated circuit module according to claim 4, wherein the patterned conductive layer further comprises a second electrode connecting to the first electrodes, and the second electrode is for testing performance of the chip.

6. The integrated circuit module according to claim 5, wherein the second insulating layer defines a third opening exposing the second electrode.

7. The integrated circuit module according to claim 1, wherein the second insulating layer is made of a material selected from the group consisting of epoxy resin, polypropylene, acrylic resin, silicone, and the combinations thereof.

8. The integrated circuit module according to claim 1, wherein the chip comprises:
   an integrated circuit device;
   an inner conductive bump electrically connected to the integrated circuit device;

a protective layer surrounding the integrated circuit device and the inner conductive bump; and an outer conductive bump located above the inner conductive bump and connected to the inner contacting portion of the carrier.

9. The integrated circuit module according to claim 1, further comprising an unfill layer surrounding the chip, the unfill layer allowing the chip to be fixed on the carrier.

10. An integrated circuit module, comprising:
a circuit board;
a chip; and
a carrier supporting the chip, the carrier defining a front side and a back side, the chip being disposed on the front side, the carrier comprising:
   a first insulating layer defining a first opening at the back side;
   a second insulating layer defining a second opening and a chip accommodation opening at the front side; and
   a patterned conductive layer sandwiched in between the first insulating layer and the second insulating layer, the patterned conductive layer being formed with an inner contacting portion exposed through the chip accommodation opening and an outer contacting portion exposed through the first opening and the second opening, wherein the chip is connected to the inner contacting portion through the chip accommodation opening, and the circuit board is connected to the outer contacting portion selectively at the front side through the second opening and the back side through the first opening, and wherein the patterned conductive layer defines a through hole in the outer contacting portion, the through hole communicating with the second opening and the first opening, and a conductive adhesive layer is added into the first opening, the second opening, and the through hole so as to adhere the carrier to the circuit board.

11. The integrated circuit module according to claim 9, wherein the first insulating layer is made of a material selected from the group consisting of polyimide, polyethylene terephthalate, epoxy resin, glass fiber, and the combinations thereof.

12. The integrated circuit module according to claim 10, wherein both the second opening and the first opening are larger than the through hole.

13. The integrated circuit module according to claim 9, wherein the inner contacting portion comprises a plurality of first electrodes for electronically connecting to the chip.

14. The integrated circuit module according to claim 13, wherein the patterned conductive layer further comprises a second electrode connecting to the first electrodes, and the second electrode is for testing performance of the chip.

15. The integrated circuit module according to claim 14, wherein the second insulating layer defines a third opening exposing the second electrode.

16. The integrated circuit module according to claim 10, wherein the second insulating layer is made of a material selected from the group consisting of epoxy resin, polypropylene, acrylic resin, silicone, and the combinations thereof.

17. The integrated circuit module according to claim 10, wherein the chip comprises:
an integrated circuit device;
an inner conductive bump electrically connected to the integrated circuit device;
a protective layer surrounding the integrated circuit device and the inner conductive bump; and
an outer conductive bump located above the inner conductive bump and connected to the inner contacting portion of the carrier.

18. The integrated circuit module according to claim 10, further comprising an unfill layer surrounding the chip, the unfill layer allowing the chip to be fixed on the carrier.

19. The integrated circuit module according to claim 18, wherein the unfill layer is made of a material selected from the group consisting of epoxy resin, polypropylene, acrylic resin, silicone, and the combinations thereof.

20. The integrated circuit module according to claim 10, further comprising a conductive adhesive layer filling the first opening, the second opening, and the through hole for connecting the circuit board and the carrier.

* * * * *